(12) United States Patent
Kajimoto

(10) Patent No.: US 7,075,339 B2
(45) Date of Patent: Jul. 11, 2006

(54) SEMICONDUCTOR OUTPUT CIRCUIT DEVICE

(75) Inventor: Takeshi Kajimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 258 days.

(21) Appl. No.: 10/218,517

(22) Filed: Aug. 15, 2002

(65) Prior Publication Data

US 2003/0052369 A1 Mar. 20, 2003

(30) Foreign Application Priority Data

Sep. 17, 2001 (JP) ............................. 2001-281179

(51) Int. Cl.
*H03K 5/153* (2006.01)
(52) U.S. Cl. ........................................ 327/87; 327/541
(58) Field of Classification Search ............ 326/82–87, 326/91; 327/108, 112, 541, 543, 87; 345/212
See application file for complete search history.

(56) References Cited

U.S. PATENT DOCUMENTS

| | | | |
|---|---|---|---|
| 5,528,192 A | | 6/1996 | Agiman |
| 5,821,808 A | * | 10/1998 | Fujima ........................ 327/541 |
| 5,889,707 A | * | 3/1999 | Yang ...................... 365/189.05 |
| 6,031,389 A | | 2/2000 | Fotouhi et al. |
| 6,107,833 A | * | 8/2000 | Yoshida ........................ 326/83 |
| 6,184,703 B1 | * | 2/2001 | Vest et al. ...................... 326/27 |
| 6,195,298 B1 | * | 2/2001 | Furutani et al. ........ 365/189.11 |
| 6,281,706 B1 | * | 8/2001 | Wert et al. ...................... 326/83 |
| 6,307,399 B1 | * | 10/2001 | Lien et al. ...................... 326/83 |

FOREIGN PATENT DOCUMENTS

| | | |
|---|---|---|
| DE | 198-49-560 C2 | 11/1999 |
| DE | 100-34-713 A1 | 2/2002 |
| EP | 0-926-829 A1 | 6/1999 |
| JP | 2-54316 | 2/1990 |
| JP | 4-291608 | 10/1992 |
| JP | 7-153271 A | 6/1995 |
| JP | 11-27132 A | 1/1999 |
| JP | 11-214977 A | 8/1999 |

* cited by examiner

*Primary Examiner*—My-Trang Nu Ton
(74) *Attorney, Agent, or Firm*—McDermott Will & Emery LLP

(57) ABSTRACT

Comparison circuits are provided, corresponding to a plurality of pull up transistors, each for comparing a voltage at an output node and each respective reference voltage different in voltage level from other, and for adjusting a drive current of a corresponding output pull up transistor, and further comparison circuits are provided, corresponding to a plurality of pull down transistors, each for comparing the voltage of the output node and each respective reference voltage different in voltage level from other, and each for adjusting an amount of a drive current of a corresponding pull down transistor in accordance with a result of comparison. The reference voltages each are set to a voltage level between a power supply voltage and a ground voltage. Without a dedicated power supply pin terminal, a signal of a small amplitude having the amplitude limited stably and precisely can be output at high speed.

14 Claims, 7 Drawing Sheets

SEMICONDUCTOR OUTPUT CIRCUIT DEVICE

BACKGROUND OF THE INVENTION

1. Field of the Invention

The present invention relates generally to semiconductor circuit devices and particularly to semiconductor output circuit devices reliably generating an output signal at high speed.

2. Description of the Background Art

Semiconductor devices such as semiconductor memory devices and semiconductor logic processing devices need to use a bus for transmitting and receiving signals/data between devices. The bus signal line, provided external to the devices, has a large lord. In order to drive the external signal line at high speed for transferring a signal/data, these semiconductor devices are each provided with an output circuit formed of a transistor having a large driving capability. With an output circuit for transferring a signal/data, the bus signal line needs to be driven to an H (logical high) level or an L (logical low) level depending on the signal/data to be transmitted.

FIG. 9 shows an exemplary configuration of a conventional semiconductor output circuit, and representatively shows a configuration of a data output circuit outputting data DQ. In FIG. 9, the semiconductor output circuit includes an output drive control circuit 100 for generating data output control signals DQH and DQL according to internal data, an inverter 102 for inverting output control signal DQH to generate a complementary output control signal /DQH, and an output buffer circuit 104 driving an output node 104a in accordance with the signal /DQH output from inverter 102 and output control signal DQL.

Output control signals DQH and DQL are generated in accordance with a data output timing signal and internal data. In outputting data, when internal output data is at an H level, output control signals DQH and DQL are set to the H and L levels, respectively, and when internal output data is at an L level, output control signals DQH and DQL are set to L and H, respectively. When data is not output, output drive control circuit 100 sets output control signals DQH and DQL both to the L level in accordance with the data output timing signal.

Output buffer circuit 104 includes a p channel MOS transistor (an insulated gate field effect transistor) Q71 connected between a power supply node receiving a power supply voltage VDD and output node 104a and having a gate receiving signal /DQH output from inverter 102, and an n channel MOS transistor Q72 connected between output node 104a and a ground node and having a gate receiving output control signal DQL. P channel MOS transistor Q71 has a backgate connected to the power supply node.

In the configuration of the semiconductor output circuit configuration shown in FIG. 9, when output control signals DQH and DQL are both at the L level, MOS transistors Q71 and Q72 are both in the OFF state (non-conductive state), and output buffer circuit 104 is in an output high impedance state.

When output control signal DQH is at the H level and output control signal DQL is at the L level, inverter 102 outputs signal /DQH of the L level and in output buffer circuit 104, MOS transistors Q71 and Q72 are set in the ON state (conductive state) and OFF state, respectively, and output node 104a is driven to the power supply voltage VDD level via MOS transistor Q71.

When output control signals DQH and DQL are at the L and H levels, respectively, MOS transistors Q71 and Q72 in output buffer circuit 104 enter the OFF and ON states, respectively, and output node 104a is driven to the ground voltage level via MOS transistor Q72 and output data DQ attains the L level.

A CMOS buffer circuit configured of p- and n-channel MOS transistors Q71 and Q72, as shown in FIG. 9, can be used to drive output node 104a to the power supply voltage VDD level and the ground voltage level.

If such an output buffer circuit is used, output node 104 accompanies a lord such as an external signal line and a lead terminal. Therefore, in order to drive the signal/data at output node 104a to the power supply voltage VDD level or the ground voltage level, some transition period of time is required. If this transition period of time is reduced by increasing the current supplying capability of output buffer circuit 104, parasitic inductance on output node 104a causes ringing of overshoot/undershoot and the signal/data cannot be transferred at high speed. Therefore, there is a limit value for a transition period of time output signal.

Furthermore, as will be described below, output data might vary in amplitude depending on an output data pattern, or on a sequence of H- and L-level signals. Specifically, as indicated in FIG. 10 by a solid line LA, when two data of the same logic level and two data of another common logic level are alternately outputted in a unit of the two data, such as in a sequence of H level data, the H level data, the L level data and the L level data, the driving time of the output node by output buffer circuit 104 in one direction is increased, and there is caused a case where an output signal varies exceeding an H side voltage level VH and a L side voltage level VL.

When output data at the H level and data at the L level are output alternately, the output node is driven in one direction for a reduced period of time. As indicated in FIG. 10 by a broken line LB, the output signal makes a transition within the H side voltage level VH and the L side voltage level VL.

Therefore, even if output data are transferred at the same frequency, the output data may vary in amplitude, depending on the data pattern to be transferred. Thus, a subsequent circuit possibly may inaccurately determine the logic level of the received data, and the data cannot be transferred at high speed. In this case, output data transitioning from H level to L level and that transitioning from L level to H level may attain an intermediary voltage level (an input logic threshold voltage level for the subsequent circuit) in different periods of time, and consequently, the subsequent circuit would have a reduced timing margin for an input signal.

Furthermore, if output data differ in frequency, signal amplitude differ similarly, and in fast data transfer, the output node comes to be driven for a reduced period of time and the output data is reduced in amplitude, while in a slow operation, the output node is driven for an increased period of time and the output data is increased in amplitude.

Furthermore, if output data of a common logic level is output successively in data pattern, an amplitude of output data would be deviated toward the H or L level, as shown in FIG. 11.

Specifically, in FIG. 11, a solid line LC represents a signal waveform in a case when data of the L level continue and data of the H level is then output, and a broken line LD represents a signal waveform in a case when data of the H level are successively read and data of the L level is then read.

For example, if data/signal of the L level continue, the data/signal transitions down to the ground voltage GND level and then to the H level, and therefore, the signal/data would vary between H-side voltage VH and ground voltage GND, as indicated in FIG. 11 by solid line LC. In contrast, if data of the H level continue, the signal/data would vary between L-side voltage VL and power supply voltage VDD, as indicated in FIG. 11 by broken line LD.

As shown in FIG. 11, if an output signal/data of the H level and an output signal/data of the L level are different in amplitude (with respect to an input logic threshold voltage Vcr of a subsequent stage), the subsequent circuit cannot take in an input signal accurately. Consequently, a margin for the input logic threshold voltage varies and an input circuit of the subsequent circuit would make an erroneous decision on H level/L level of input data.

Thus, in order to reliably transfer data/signal at high speed, it is required to transfer a signal/data transitioning in the same amplitude with the input logic threshold voltage Vcr of the subsequent circuit being the center. Particularly, by transferring a signal smaller in amplitude than power supply voltage VDD through amplitude limitation, charging and discharging current of an external signal line can be reduced, and consequently, power consumption can be advantageously reduced, in addition to the advantage of fast transfer of data/signal.

FIG. 12 schematically shows a configuration of a conventional semiconductor circuit device. In FIG. 12, a semiconductor circuit device 110 includes a semiconductor circuit 112 performing a predetermined process to generate output control signals DQL and /DQH, and an output buffer circuit 114 generating output data DQ in accordance with output control signals /DQH and DQL of semiconductor circuit 112. Output buffer circuit 114 includes a p channel MOS transistor Q91 pulling up an output node in accordance with output control signal /DQH and an n channel MOS transistor Q92 pulling down the output node in accordance with output control signal DQL.

Semiconductor circuit 112 receives power supply voltage VDD through a power supply terminal 115 and ground voltage VSS through a ground terminal 116. Output buffer circuit 114 receives a high-side output power supply voltage VDDQ though an output power supply terminal 117 and a low-side output power supply voltage VSSQ through a power supply terminal 118.

Power supply voltage VDDQ and VSSQ are different in level from power supply voltage VDD and VSS supplied to semiconductor circuit 112, respectively. Specifically, output power supply voltage VDDQ is at a level lower than power supply voltage VDD and output power supply voltage VSSQ is at a level higher than ground voltage VSS. By supplying power supply voltage VDDQ and VSSQ dedicatedly to the output circuit, output buffer circuit 114 can output data DQ having an amplitude smaller than power supply voltage VDD. Furthermore, whatever pattern output data may have, an output signal can be prevented from having a voltage level shifted in one direction.

Semiconductor circuit device 110 is assembled on a substrate or board limited in the kinds of power sources. Thus, there is caused a problem that it is difficult to supply power supply voltages VDDQ and VSSQ exclusively to the output circuit. Therefore, output buffer circuit 114 cannot receive power supply voltages VDDQ and VSSQ of an optimized voltage level and, as described with reference to FIG. 11, signal waveform distortion and H level/L level amplitude deviation are caused and data/a signal cannot be transferred reliably at high speed. It is thus necessary to limit an amplitude of output signal/data while maintaining power supply voltage level.

FIG. 13 shows a configuration of a data output portion of a conventional semiconductor circuit having an amplitude limiting function. In FIG. 13, a semiconductor circuit device 120 includes an output buffer circuit 122 driving an output node 125 in accordance with output control signals /DQH and DQL, and an amplitude limiting circuit 124 for limiting the amplitude of data DQ output from output node 125. These output buffer circuits 122 and 124 receive power supply voltage VDD as one operating power supply voltage and ground voltage GND as the other power supply voltage.

Output buffer circuit 122 includes a p channel MOS transistor Q1a pulling up the voltage of output node 125 in accordance with output control signal /DQH, and an n channel MOS transistor Q2a pulling down the voltage of output node 125 in accordance with output control signal DQL.

Amplitude limiting circuit 124 includes a resistance element RH connected between a power supply node and output node 125, and a resistance element RL connected between output node 125 and a ground node.

In the semiconductor circuit device shown in FIG. 13, when output control signals /DQH and DQL both are at the L level, output node 125 is supplied with current via MOS transistor Q1a. The current supplied through MOS transistor Q1a and resistance element RH is discharged to the ground node through resistance element RL. Thus, the H level data has a voltage V (H), as represented in the following expression:

$$V(H)=RL \cdot VDD/(ON(Q1a)//RH+RL),$$

where ON (Q1a) represents the channel resistance of MOS transistor Q1a. Resistance element RL has a resistance value represented by the same reference character RL. The symbol "//" represents a parallel combined resistance of the channel resistance (or ON resistance) ON (Q1a) of MOS transistor Q1a and resistance element RH.

When output control signals /DQH and DQL both are at the H level, output node 125 is discharged via MOS transistor Q2a to the ground voltage level. In this case, current is discharged from resistance element RH through MOS transistor Q2a and resistance element RL to the ground node. Thus, when the L level data is generated, output node 125 is at a voltage V (L), as represented in the following expression:

$$V(L)=(ON(Q2a)//RL) \cdot VDD/(RH+ON(Q2a)//RL),$$

where ON (Q2a) represents the channel resistance of MOS transistor Q2a.

In order to set the output voltage V (H) and V (L) at a voltage level between power supply voltage VDD and the ground voltage with resistance elements RH and RL, resistance elements RH and RL need to be made substantially the same in resistance value as the channel resistance (ON resistance) of the MOS transistors Q1a and Q2a. Typically, outputting MOS transistors Q1a and Q2a have channel resistance (ON resistance) of several tens Ω. If resistance elements RH and RL have a value in resistance of approximately the same level, this output portion would constantly cause a through-current of several tens mA to flow through resistance elements RH and RL. That is, irrespective of whether or not data output is performed, amplitude limiting circuit 124 constantly flows the through-current, and current consumption, standby current in particular, would disadvantageously be increased. In particular, if this semiconductor circuit device is a semiconductor memory device and outputs multibit data, the though-current further increases and semiconductor memory device cannot operate with low standby current.

Furthermore, the ON resistances of MOS transistors Q1a and Q2a and the resistance values of resistance elements RH and RL vary if a process parameter varies in the manufacturing process. When the ON resistances of outputting MOS transistors Q1a and Q2a and the resistance values of resistance elements RH and RL vary, output data DQ accordingly varies in amplitude, and a signal having a small, constant amplitude is hardly generated.

Furthermore, if output node 125 connects with different loads for different system configurations, data from output node 125 differ in amplitude for different systems accordingly.

FIG. 14 shows still another configuration of the output portion of the conventional semiconductor circuit device. In FIG. 14, semiconductor circuit device 130 includes an output buffer circuit 132a for driving an output node 132a in accordance with output control signals /DQH and DQL, and a current limiting resistance element RS connected between output node 132a and an external signal line 140.

External signal line 140 is coupled with a terminating voltage source 142 through a terminating resistance element RT. Terminating voltage source 142 supplies an intermediate voltage VDD/2.

In the configuration shown in FIG. 14, when MOS transistor Q1b is in an ON state, current flows to terminating voltage source 142 through MOS transistor Q1b, resistance element RS and terminating resistance RT. Thus, when data DQ is at the H level, the H level data has a voltage level V (DQH), as represented in the following equation:

$$V(DQH)=VDD \cdot RT/2 \cdot (ON(Q1b)+RS+RT)+VDD/2,$$

where ON (Q1b) represents the channel resistance (or ON resistance) of MOS transistor Q1b.

When MOS transistor Q2b is in the ON state, current flows from terminating voltage source 142 though resistance elements RT and RS and MOS transistor Q2b to the ground node. Thus, when data DQ is at the L level, the data has a voltage level V (DQL), as represented in the following expression:

$$V(DQL)=VDD \cdot (ON(Q2b)+RS)/2(ON(Q2b)+RS+RT),$$

wherein ON (Q2b) represents the channel resistance (or ON resistance) of MOS transistor Q2b.

As in the configuration shown in FIG. 14, when terminating resistance RT is used to provide output data DQ smaller in amplitude than power supply voltage VDD, resistance elements RS and RT need to be substantially the same in resistance value as the ON resistance of MOS transistors Q1b and Q2b. Thus, terminating resistance RT conducts relatively large current flow.

Furthermore, when the ON resistance of MOS transistors Q1b and Q2b are significantly varied, due to the variation in process parameter in a manufacturing process, operation temperature, or power supply voltage, as compared with the resistance elements RT and RS, output data DQ significantly varies in amplitude, as described below.

Specifically, for manufacturing parameter variation, the MOS transistor has an ON resistance varying in a range of approximately ±10 to 20%. In addition, as to the variation of ON resistance of MOS transistor for the operation temperature variation, the ON resistance of MOS transistor varies in a range of approximately ±8 to 16% for a temperature variation of 100° C. Furthermore, for a variation in power supply voltage of ±10%, the ON resistance of MOS transistor varies in a range of approximately ±10 to 15%. When these variation factors are all taken into account, the MOS transistor has an ON resistance varying in a range of approximately ±28 to 51%.

From the above expressions, output data DQ has an amplitude of V (DQH)–V(DQL), as represented by the following equation:

$$V(DQH)-V(DQL)=VDD \cdot RT/(ON(Q2b)+RT+RS),$$

where MOS transistors Q1b and Q2b are assumed to be equal in ON resistance. When the MOS transistor has its ON resistance varied, output data also varies in amplitude. If such variation factors as described above cause the ON resistance of MOS transistor to vary to increase output data in amplitude, data cannot be transferred at high speed and current consumption also increases disadvantageously.

Furthermore, if semiconductor circuit device 130 is a semiconductor memory device and outputs, as data DQ, data of as many as 64 bits, terminating voltage source 142 is required to supply terminating voltage VDD/2 to the 64 bits of data in common. In this context, if the 64-bits as many of data vary in a single direction, several hundreds mA of current would be consumed. Accordingly, while such current is consumed in the output circuits, the voltage level of terminating voltage VDD/2 is required to be held constant, and a severe requirement is imposed on terminating power supply source 142.

In particular, if a terminating voltage source is formed of a simple voltage dividing circuit, the terminating voltage source would accompany an increased through-current, which is unsuitable for low power consumption systems. There arises a problem that it is difficult to configure a terminating power source with a small occupation area, small power consumption and great current supplying capability.

Thus, according to the configuration of an output circuit in a conventional semiconductor circuit device, an output signal/data of a small amplitude could not transferred at high speed stably with small power consumption.

SUMMARY OF THE INVENTION

An object of the present invention is to provide a semiconductor circuit device capable of generating an output signal/data of a small amplitude accurately and stably.

Another object of the present invention is to provide a semiconductor circuit device capable of accurately generating an output signal of a desired amplitude without any additional power supply terminal.

According to a first aspect of the present invention, a semiconductor circuit device includes a first output transistor coupled between a first power supply node and an output node, and a first output control circuit activated in response to a first output control signal to compare a voltage of the output node with a first reference voltage and controlling the amount of current flowing through the first output transistor in accordance with the result of the comparison.

According to a second aspect of the present invention, a semiconductor circuit device includes: a plurality of pull up transistors connected between a first power supply node and an output node in parallel; a first reference voltage generation circuit for generating a plurality of pull up reference voltages corresponding to the plurality of pull up transistors and having different voltage levels from each other; a plurality of pull up control circuits, arranged corresponding to the plurality of pull up transistors, each activated in response to a first output control signal to compare a voltage of the output node with a corresponding pull up reference voltage generated by the first reference voltage generation circuit, for controlling a potential of a control electrode of the corresponding pull up transistor in accordance with the result of comparison; a plurality of pull down transistors connected between a second power supply node and the output node in parallel; a second reference voltage generation circuit for generating a plurality of pull down reference voltages corresponding to the plurality of pull down transistors and having different voltage levels from each other; and a plurality of pull down control circuits, arranged corresponding to the plurality of pull down transistors, each activated in response to a second output control signal to compare the voltage of the output node with a corresponding pull down reference voltage, and controlling a potential of a control electrode of the corresponding pull down transistor in accordance with the result of comparison.

An output node voltage is compared with a reference voltage and the output transistor is controlled in accordance with a result of comparison. Thus, the voltage level of output node voltage can be set to a voltage level corresponding to the reference voltage level. When the reference voltage is set to a voltage level different from the power supply voltage, a signal can be generated which constantly has an amplitude limited to a desired voltage level, irrespective of variation of an external system load or a transistor parameter.

In particular, when the reference voltage generation circuit is provided with a trimming function, the reference voltage can be finely tuned in level, and a signal is generated which has an amplitude limited to a desired voltage level without adverse influence of variation in process parameter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
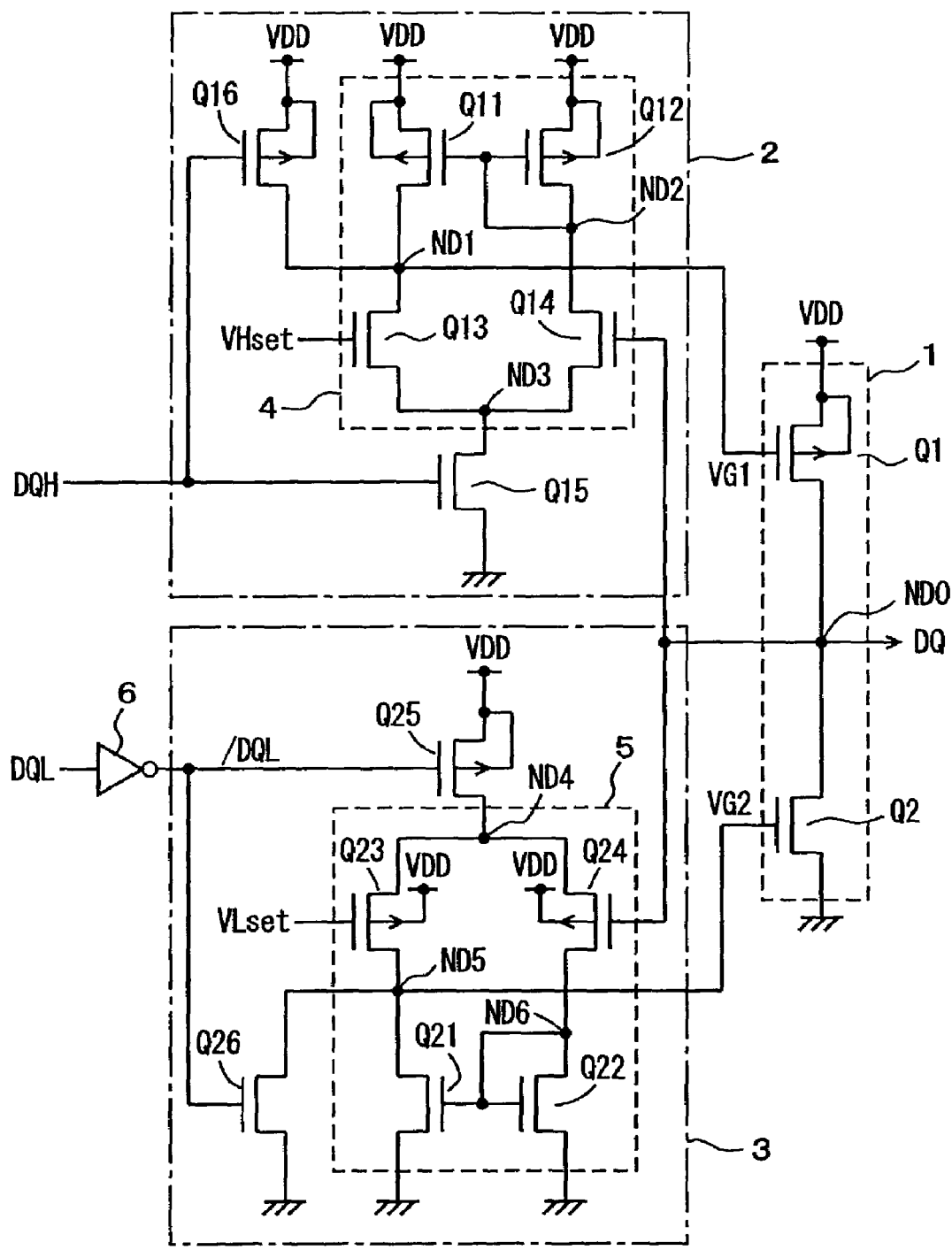
FIG. 1 shows a configuration of a semiconductor circuit device according to a first embodiment of the present invention.
Figure 9:
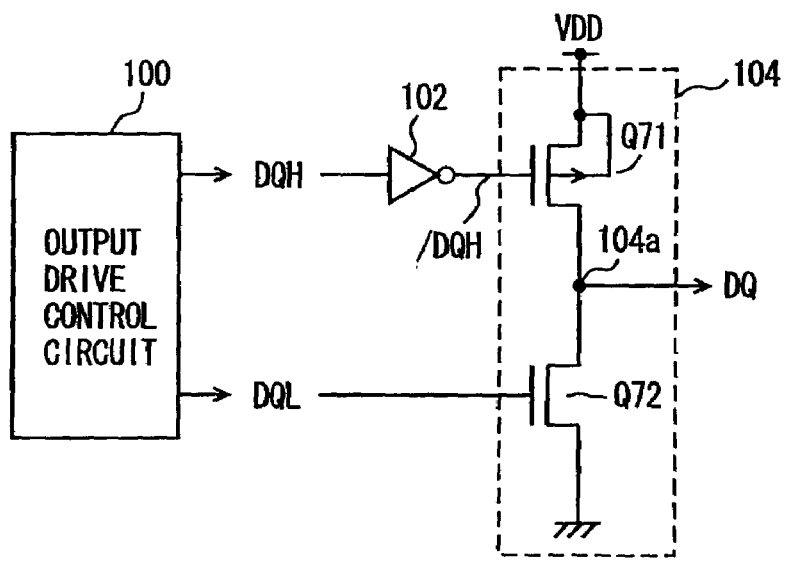
FIG. 9 shows an exemplary configuration of a conventional output circuit.
Figure 10:
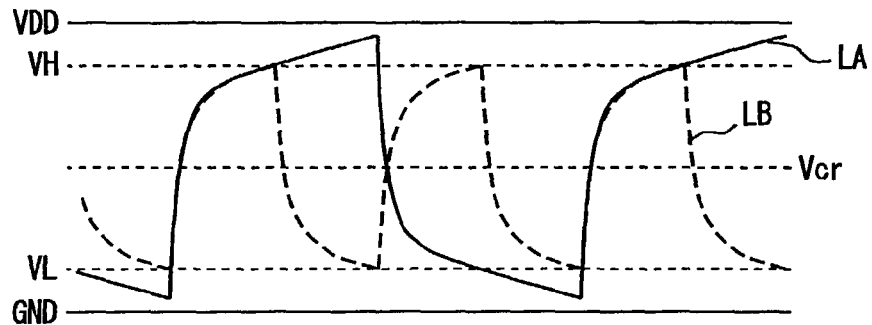
FIG. 10 shows the variation in amplitude of the output signal for the different operating frequency in the output circuit shown in FIG. 9.
Figure 11:
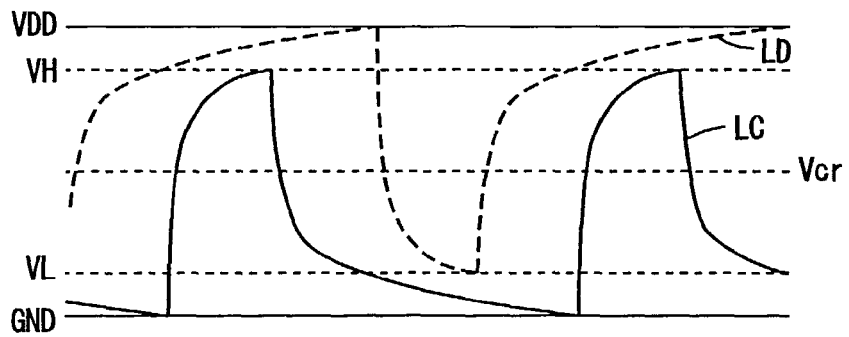
FIG. 11 represents a waveform of an output signal in a high speed operation from the semiconductor circuit device shown in FIG. 9.
Figure 12:
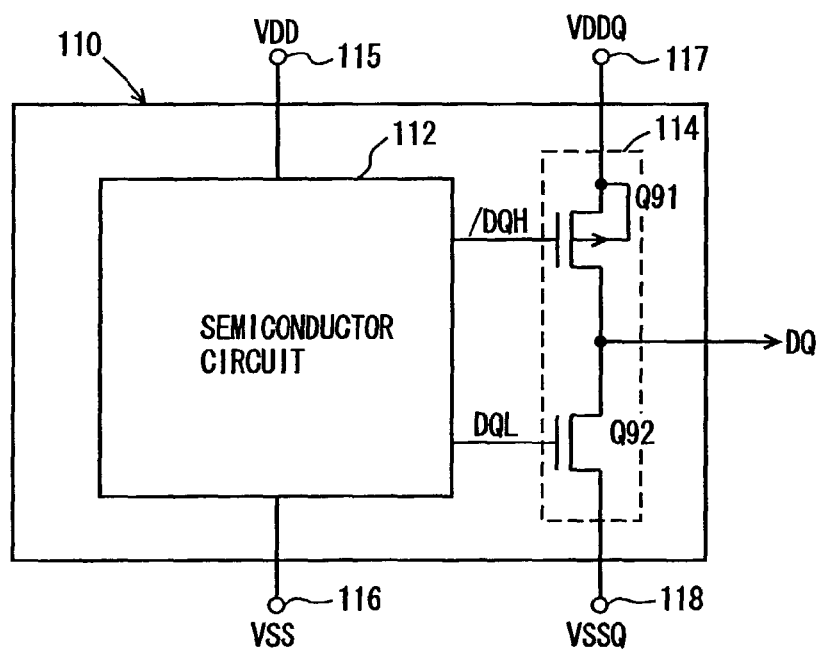
FIG. 12 shows an example of an entire configuration of a conventional semiconductor circuit device.
Figure 13:
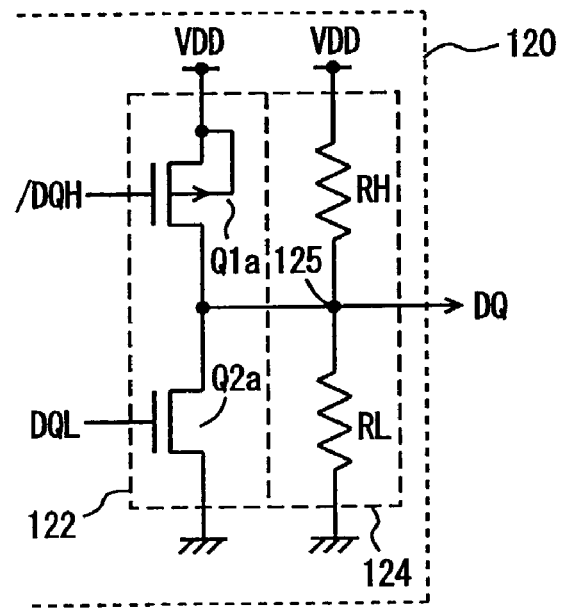
FIG. 13 shows an exemplary configuration of a conventional output circuit with an amplitude limiting function.
Figure 14:
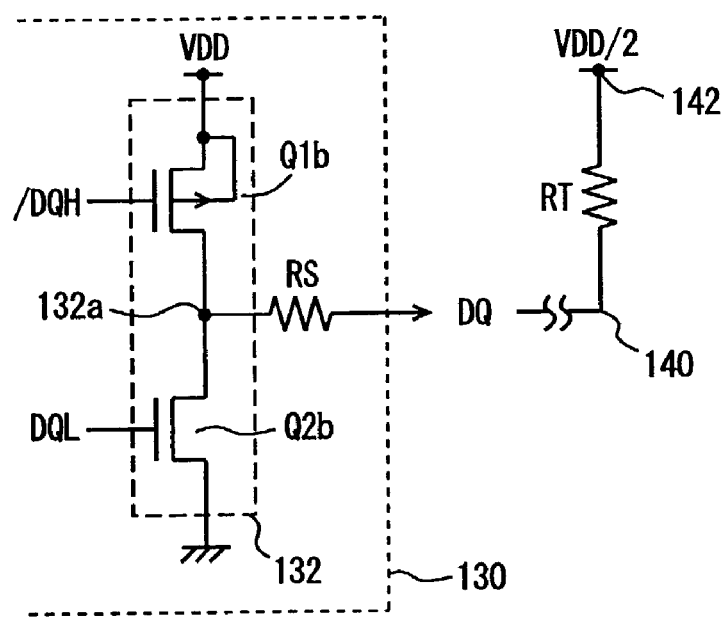
FIG. 14 shows a configuration of another conventional output circuit with an amplitude limiting function.

FIG. 1 shows a configuration of an output section of a semiconductor circuit device accordance with a first embodiment of the present invention. In FIG. 1, a data output node ND0 is driven in accordance with output control signals DQH and DQL output from an output drive control circuit 100 shown in FIG. 9. Although an operation of a data output section for outputting data DQ hereinafter, the output circuit according to the present invention can be a normal circuit for outputting a control signal, for example.

In FIG. 1, the data output circuit includes a comparison circuit 2 enabled when output control signal DQH is activated, to compare the voltage of output node ND0 with a reference voltage VHset, a comparison circuit 3 enabled when output control signal DQL is activated, to compare the voltage of output node ND0 with a reference voltage VLset, and an output buffer circuit 1 driving output node ND0 in accordance with the signals VG1 and VG2 output from comparison circuits 2 and 3.

Output buffer circuit 1 includes a p channel MOS transistor Q1 connected between a power supply node and output node ND0 and having a gate receiving the signal VG1 output from comparison circuit 2, and an n channel MOS transistor Q2 connected between an output node and a ground node and having a gate receiving the signal VG2 output from the comparison circuit 3.

Comparison circuit 2 includes a differential amplification circuit 4 enabled to compare the voltage of output node ND0 with reference voltage VHset for generating a drive control signal VG1 in accordance with the result of comparison, an n channel MOS transistor Q15 enabling differential amplification circuit 4 when output control signal DQH is activated, and a p channel MOS transistor Q16 for holding output drive control signal VG1 at the level of a power supply voltage VDD when the output drive control signal VG1 is inactivated.

Differential amplification circuit 4 includes a p channel MOS transistor Q11 connected between a power supply node and node ND1 and having a gate connected to a node ND2, a p channel MOS transistor Q12 connected between a power supply node and node ND2 and having a gate connected to node ND2, an n channel MOS transistor Q13 connected between nodes ND1 and ND3 and having a gate receiving reference voltage VHset, and an n channel MOS transistor Q14 connected between nodes ND3 and ND4 and having a gate connected to output node ND0.

A MOS transistor Q15 is connected between node ND3 and a ground node and has a gate receiving output control signal DQH. A MOS transistor Q16 is connected between a power supply node and node ND1 and has a gate receiving output control signal DQH. MOS transistors Q11, Q12 and Q16 have their respective backgates connected to a power supply node.

In the configuration of comparison circuit 2, when output control signal DQH is at an L level of an inactive state, MOS transistors Q15 and Q16 are in OFF and ON states, respectively. In differential amplification circuit 4, a path flowing an operating current is cut off, and differential amplification circuit 4 maintains an inactive state. Node ND1 is held by MOS transistor Q16 at the power supply voltage VDD level. In this state, output drive control signal VG1 is at the power supply voltage VDD level and in output buffer circuit 1, MOS transistor Q1 maintains an OFF state.

When output control signal DQH attains the H level, MOS transistors Q15 and Q16 enter ON and OFF states, respectively. Thus, a path flowing an operating current in differential amplification circuit 4 is formed and differential amplification circuit 4 performs differential amplification.

In differential amplification circuit 4, MOS transistors Q11 and Q12 configure a current mirror circuit and mirror current of current flowing through MOS transistor Q12 flows through MOS transistor Q11. MOS transistors Q13 and Q14 configure a differential stage to differentially amplify reference voltage VHset and the voltage of output node ND0.

When reference voltage VHset is lower than the voltage of output node ND0, MOS transistor Q14 becomes greater in conductance than MOS transistor Q13, and MOS transistors Q12 and Q14 cause large current to flow. The mirror current from MOS transistor Q11 cannot all be discharged via MOS transistor Q13, and output drive control signal VG1 at node ND1 has the voltage level increased to the H level (the power supply voltage VDD level). and in output buffer circuit 1, MOS transistor Q1 turns OFF state.

When the voltage at output node ND0 is lower than reference voltage VHset, MOS transistor Q13 becomes greater in conductance than MOS transistor Q14, MOS transistor Q13 can discharge all of mirror current supplied from MOS transistor Q11, and output drive control signal VG1 at node ND1 attains the L level, and MOS transistor Q1 supplies output node ND0 with current.

The H level of data DQ from output node ND0 is thus sets to the voltage level of reference voltage VHset.

Comparison circuit 3 includes a differential amplification circuit 5 enabled to differentially amplify reference voltage VLset and the voltage of output node ND0, a p channel MOS transistor Q25 rendered conductive in response to an L level of complimentary output control /DQL applied through an inverter 6 receiving output control signal DQL, to supply differential amplification circuit 5 with an operating current, and an n channel MOS transistor Q26 rendered conductive in response to an H level of complementary output control signal /DQL and holding output drive control signal VG2 from differential amplification circuit 5 at the ground potential level.

Differential amplification circuit 5 includes a p channel MOS transistor Q23 connected between an internal operation power supply node ND4 and node ND5 and having a gate receiving reference voltage VLset, a p channel MOS transistor Q24 connected between nodes ND4 and ND6 and having a gate connected to output node ND0, an n channel MOS transistor Q21 connected between node ND5 and a ground node and having a gate connected to node ND6, and an n channel MOS transistor Q22 connected between node ND6 and a ground node and having a gate connected to node ND6.

A MOS transistor Q25 transmits power supply voltage VDD to differential amplification circuit 5 at internal operation power supply node ND4 when rendered conductive.

In the configuration of differential amplification circuit 5, MOS transistors Q21 and Q22 form a current mirror circuit and mirror current of current flowing through MOS transistor Q22 flows through MOS transistor Q21.

MOS transistors Q23 and Q24 form a differential stage for differentially amplifying reference voltage VLset and the voltage of output node ND0. MOS transistors Q23 and Q24 have their backgates connected to receive power supply voltage VDD for the following reasons: to prevent a substrate region from entering a floating state to unstable substrate potential when differential amplification circuit 5 is in an inactive state; and to form MOS transistors Q25, Q23 and Q24 in a common well or substrate region to reduce a circuit occupation area.

In comparison circuit 3, when output control signal DQL is at the L level and complementary output control signal /DQL is at the H level, MOS transistors Q25 and Q26 are in OFF and ON states, respectively. Thus, differential amplification circuit 5 maintains an inactive state, output drive control signal VG2 at node ND5 is at the ground potential level, and MOS transistor Q2 in output buffer circuit 1 is maintained in the OFF state.

When comparison circuit 3 is in the inactive state, MOS transistor Q25 is in the OFF state and differential amplification circuit 5 is not supplied with operating current. Thus, node ND4 is discharged down to the ground voltage level.

When output control signal DQL attains the H level, complementary output control signal /DQL attains the L level, and MOS transistors Q25 and Q26 are rendered conductive and non-conductive, respectively. Differential amplification circuit 5 receives operating current through MOS transistor Q25, and performs differential amplification and generates output drive control signal VG2 according to the difference in voltage between the voltage of output node ND0 and reference voltage VLset.

When output node ND0 attains a voltage level higher than reference voltage VLset, MOS transistor Q23 is greater in conductance than MOS transistor Q24, and MOS transistor Q23 flows a current of an amount greater than that of current flowing through MOS transistor Q24. MOS transistor Q22 discharges to a ground node the current supplied from MOS transistor Q24, and MOS transistor Q21 flows a mirror current of the current flowing through MOS transistor Q22. Thus, in this state, MOS transistor Q23 receives a current of an amount greater than the mirror current flowing through MOS transistor Q21, node ND5 is increased in voltage level, output drive control signal VG2 is increased in voltage level, and MOS transistor Q2 is rendered conductive.

When output node ND0 is lower in voltage level than reference voltage VLset, MOS transistor Q24 becomes greater in conductance than MOS transistor Q23, and MOS transistor Q24 flows a current of an amount greater than that of current flowing through MOS transistor Q23. In this condition, output drive control signal VG2 at node ND5 attains the ground voltage level, and MOS transistor Q2 is rendered non-conductive in output buffer circuit 1.

The L level of output voltage DQ from output node ND0 is thus set to the voltage level of reference voltage VLset.

Reference voltage VHset is set lower than power supply voltage VDD while reference voltage VLset is set higher than the ground voltage individually. Thus, in the configuration using power supply voltage VDD and ground voltage GND as operating power supply voltages to drive the output circuit, output data DQ can have the amplitude determined by the reference voltages, and therefore, a signal having a small amplitude smaller than power supply voltage VDD can be generated. Output data DQ can have its amplitude set to a desired value in accordance with the voltage levels of the reference voltages VHset and VLset. Furthermore, power supply voltage VDD can merely be used and any additional power supply terminal for amplitude limitation can also be dispensed with.

Figure 2:
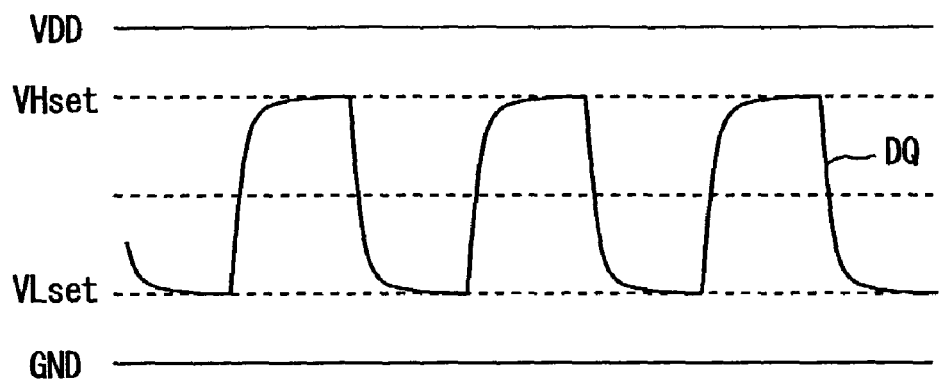
FIG. 2 is a signal waveform diagram representing an operation of the semiconductor circuit device shown in FIG. 1.

FIG. 2 is a signal waveform representing an operation of the output circuit shown in FIG. 1. As shown in FIG. 2, while the output circuit is supplied with power supply voltage VDD and ground voltage GND as operating power supply voltages, comparison circuits 2 and 3 can limit the H level and L level of output data DQ to the level of reference voltage VHset and the level of reference voltage VLset, respectively. Thus, even in a high speed operation, output data DQ is amplitude-limited to the voltages VHset and VLset, and can be transferred at high speed without waveform distortion.

Furthermore, even if output data pattern is non-uniform or data of common logic level are successively output, output data DQ, having its high and L levels set to reference voltages VHset and VLset, respectively, would not be driven to the power supply voltage VDD or ground voltage GND level. Thus, output data DQ is not shifted in potential level in one direction and it can thus be accurately transmitted at high speed.

Furthermore, by using the comparison circuits 2 and 3 shown in FIG. 1 to limit amplitude, a CMOS-level signal can be converted into a signal of a small amplitude adapted to a circuit device having an interface of small amplitude, such as stub series terminated transistor logic (SSTL), a center tap terminated interface (CTT), for transmission.

Thus, by utilizing a differential amplification circuit receiving a reference voltage for the H/L level of such a small-amplitude interface as an input buffer circuit in an input section, the semiconductor circuit device according to the present embodiment can also be applied to a system including an interface circuit transmitting a signal of a small amplitude.

Figure 3:
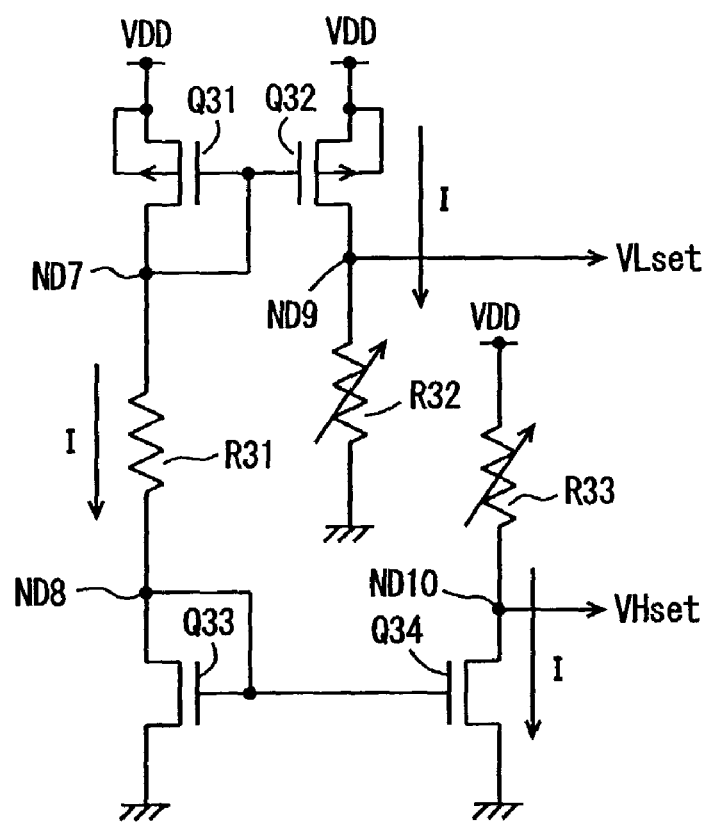
FIG. 3 shows an exemplary configuration of a circuit generating a reference voltage shown in FIG. 1.

FIG. 3 shows an exemplary configuration of a reference voltage generation circuit for generating reference voltage VHset and VLset shown in FIG. 1. In FIG. 3, the reference voltage generation circuit includes a p channel MOS transistor Q31 connected between a power supply node and a node ND7 and having a gate connected to node ND7, a resistance element R31 connected between nodes ND7 and ND8, an n channel MOS transistor Q33 connected between node ND8 and a ground node and having a gate connected to node ND8, a p channel MOS transistor Q32 connected between a power supply node and a node ND9 and having a gate connected to node ND7, a resistance element R32 connected between node ND9 and a ground node, a resistance element R33 connected between a power supply node and a node ND10, and an n channel MOS transistor Q34 connected between node ND10 and a ground node and having a gate connected to node ND8.

Resistance elements R32 and R33 can have their resistance value adjustable, for example, by means of laser trimming. Resistance elements R32 and R33 are formed of, for example, unit resistance elements connected in series and link elements connected in parallel to the unit resistance elements. In the laser trimming, link elements connected in parallel to the unit resistance elements are selectively blown off, for example, by means of laser, to adjust their resistance values.

Resistance element R31 has its resistance value made sufficiently greater than the channel resistance (ON resistance) of MOS transistors Q31 and Q33. Under this condition, MOS transistors Q31 and Q33 operate in a diode mode and each cause a voltage drop by an absolute value of a threshold voltage. Thus, current I is represented by the following expression:

$$I=(VDD-|Vthp|-Vthn)/R31,$$

where Vthp and Vthn represent a threshold voltage of MOS transistor Q31 and that of MOS transistor Q33, respectively, and R31 represents a resistance value of resistance element R31. Current I is a constant current if power supply voltage VDD is constant.

MOS transistors Q31 and Q32 form a current mirror circuit and if they are the same in size, the current I flows through MOS transistor Q32. If variable resistance element R32 has a resistance value R32, reference voltage VLset generated at node ND9 is represented by the following expression:

$$VLset=I \cdot R32.$$

Furthermore, MOS transistors Q33 and Q34 form a current mirror and if they are the same in size, the current I flows through MOS transistor Q34. Thus, reference voltage VHset generated at node ND11 is represented by the following expression:

$$VHset=VDD-I \cdot R33.$$

Adjusting individually the resistance values of resistance elements R32 and R33 allows reference voltage VLset and VHset each to be set to a voltage level as desired. In particular, if resistance elements R32 and R33 are the same in resistance value, VLset and VDD minus VHset can be set to the same voltage level, and data having H and L levels, the same in amplitude with VDD/2 being a center, can be transmitted.

Furthermore, resistance elements R32 and R33 each formed of a laser trimmable resistance elements having a resistance value programmable allow reference voltage VLset and VHset to be set to a voltage level as desired, even if device characteristics vary due to variation in process parameter or in the manufacturing process or others. For example, if a process parameter varies and accordingly MOS transistors Q31 and Q33 has the threshold voltage varied and resistance element R31 has the resistance value varied, current I varies in value. In this case, resistance elements R32 and R33 can be laser-trimmed to have their resistance values adjusted to set each of reference voltage VLset and VHset to a voltage level as desired.

In particular, with the reference voltage VLset and VHset generated through their individual separate paths, resistance elements R32 and R33 allow reference voltage VLset and VHset each to have the voltage levels individually adjusted, to produce, with high precision, a signal having an amplitude as desired.

Furthermore, reference voltage VLset and VHset are applied to the differential amplification circuits 5 and 4 shown in FIG. 1, respectively, and applied to the gates of MOS transistors. Therefore, reference voltage VLset and VHset are only required to charge the gate capacitances of MOS transistors Q23 and Q13 shown in FIG. 1, and it is not required to have a large current driving capability, and current I can have a value reduced to the order of μA. Thus, the reference voltage generation circuit can be sufficiently reduced in current consumption.

The reference voltage generation circuit shown in FIG. 3 generates current I depending on power supply voltage VDD. The circuit configuration is simplified to reduce a circuit layout area. However, a reference current generation circuit may be used to generate the current that does not depend on the power supply voltage.

Furthermore, differential amplification circuits 4 and 5 may output a signal changing in an analog manner, as described above, or they may output a signal changing digitally between the two values of H and L levels.

In accordance with the first embodiment of the present invention, when an output control signal is activated, voltage at an output node is compared with a reference voltage and the output transistor is controlled in accordance with a result of the comparison. Thus, an amplitude of a signal/data of the output node can be limited to the level of the reference voltage, and without any additional power supply terminal for limiting current, a signal of a small amplitude as desired can be generated with high procession and low power consumption.

Second Embodiment

Figure 4:
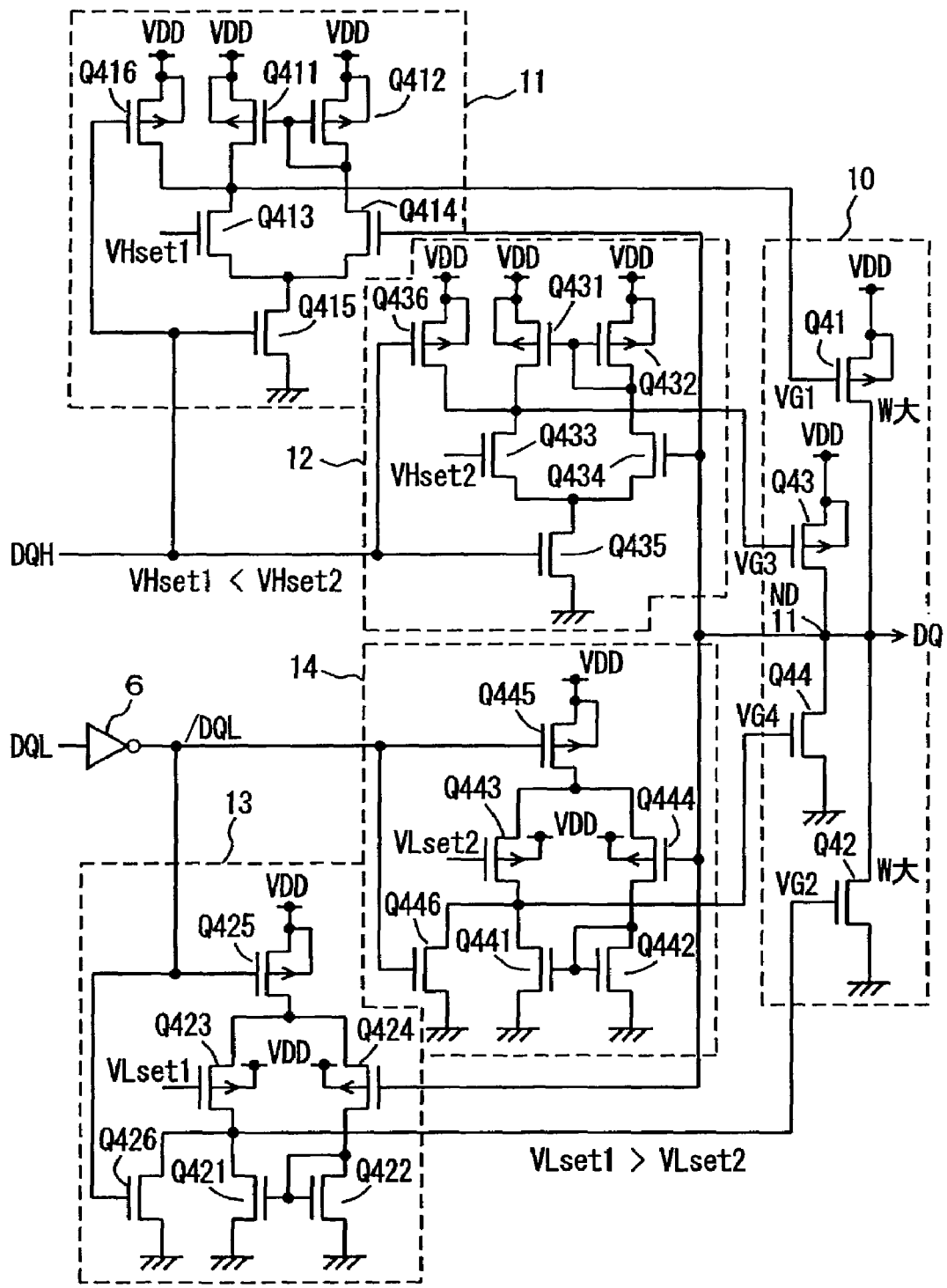
FIG. 4 shows a configuration of a semiconductor circuit device according to a second embodiment of the present invention.

FIG. 4 shows a configuration of a semiconductor circuit device in accordance with a second embodiment of the present invention. In FIG. 4, the semiconductor circuit device includes a comparison circuit 11 enabled when output control signal DQH is activated, to compare the voltage of an output node ND11 with a reference voltage VHset1, to generate output drive control signal VG1 in accordance with the result of comparison, a comparison circuit 12 enabled when output control signal DQH is activated, to compare the voltage of output node ND11 with a reference voltage VHset2 to generate an output drive control signal VG3 in accordance with the result of comparison, a comparison circuit 13 enabled when output control signal DQL is activated, to compare the voltage of output node ND11 with a reference voltage VLset1 for generating an output drive control signal VG2 in accordance with the result of comparison, a comparison circuit 14 enabled when output control signal DQL is activated, to compare the voltage of output node ND11 with a reference voltage VLset2 for generating an output drive control signal VG4 in accordance with the result of comparison, and an output buffer circuit 10 for driving output node ND11 to generate output data DQ in response to output drive control signals VG1–VG4.

Reference voltage VHset1 is lower than reference voltage VHset2 and reference voltage VLset1 is higher than reference voltage VLset2.

Output buffer circuit 10 includes a p channel MOS transistor Q41 connected between a power supply node and output node ND11 and having a gate receiving output drive control signal VG1, a p channel MOS transistor Q43 connected between a power supply node and output node ND11 and having a gate receiving output drive control signal VG3, an n channel MOS transistor Q42 connected between output node ND11 and a ground node and having a gate receiving output drive control signal VG2, and an n channel MOS transistor Q44 connected between output node ND11 and a ground node and having a gate receiving output drive control signal VG4.

MOS transistor Q41 is made larger in size (or channel width to channel length ratio W/L) than MOS transistor Q43, and MOS transistor Q42 is made larger in size than MOS transistor Q44. Thus, MOS transistors Q41 and Q42 have a greater current supply ability than MOS transistors Q43 and Q44 under the condition of the same gate to source voltage.

Output buffer circuit 10 pulls up output node ND11 in two steps in response to output drive control signals VG1 and VG3 and pulls down output node ND11 in two steps in response to output drive control signals VG2 and VG4.

Comparison circuit 11 includes p channel MOS transistors Q411 and Q412 coupled with a power supply node and forming a current mirror circuit, an n channel MOS transistors Q413 and Q414 forming a differential stage receiving current from MOS transistors Q411 and Q412 and comparing the voltage of output node ND11 with reference voltage VHset1, an n channel MOS transistor Q415 rendered conductive when output control signal DQH is activated, and forming a path flowing an operating current for a differential amplification circuit configured by MOS transistors Q411–Q414 when rendered conductive, and a p channel MOS transistor Q416 rendered conductive when output control signal DQH is inactivated, and holding output drive control signal VG1 at the power supply voltage VDD level when rendered conductive. Output drive control signal VG1 is generated at a node connected to MOS transistors Q411 and Q413.

Comparison circuit 12 includes p channel MOS transistors Q431 and Q432 forming a current mirror circuit, n channel MOS transistors Q433 and Q434 forming a differential stage comparing the voltage of output node ND11 with reference voltage VHset2, an n channel MOS transistor Q435 rendered conductive when output control signal DQH is activated, to form a path flowing an operating current through MOS transistors Q431–Q434, and a p channel MOS transistor Q436 rendered conductive when output control signal DQH is inactivated, and holding output drive control signal VG3 at the power supply voltage VDD level when rendered conductive.

MOS transistors Q431–Q434 form a differential amplification circuit, and when MOS transistor Q435 functions as a current source transistor for the differential amplification circuit when rendered conductive. Output drive control signal VG3 is taken out from a node connecting MOS transistors Q431 and Q433.

Comparison circuit 13 includes p channel MOS transistors Q423 and Q424 forming a differential stage for comparing the voltage of output node ND11 with reference voltage VLset1, n channel MOS transistors Q421 and Q422 forming a current mirror circuit flowing current the same in magnitude through MOS transistors Q423 and Q424, a p channel MOS transistor Q425 rendered conductive when complementary output control signal /DQL output from inverter 6 receiving output control signal DQL is activated, to supply MOS transistors Q423 and Q424 with power supply voltage VDD, and an n channel MOS transistor Q426 rendered conductive when complementary output control signal /DQL is inactivated, to hold output control signal VG2 at the ground voltage level.

Output drive control signal VG2 is generated at a connecting node between MOS transistors Q423 and Q421. MOS transistors Q421–Q424 form a differential amplification circuit and MOS transistor Q425 functions as a current source transistor for the differential amplification circuit, when rendered conductive.

MOS transistor Q422 serves as a master stage of the current mirror circuit. MOS transistors Q423 and Q424 have their backgates coupled with a power supply node.

Comparison circuit 14 includes n channel MOS transistors Q441 and Q442 forming a current mirror circuit, p channel MOS transistors Q443 and Q444 forming a differential stage having current driven by MOS transistors Q441 and Q442 to compare the voltage of output node ND11 with reference voltage VLset2, a p channel MOS transistor Q445 rendered conductive when complementary output control signal /DQL is activated, to transmit power supply voltage VDD to MOS transistors Q443 and Q444, and an n channel MOS transistor Q446 rendered conductive when complementary output control signal /DQL is inactivated, to hold output drive control signal VG4 at the ground voltage level. Output drive control signal VG4 is generated at a node connecting MOS transistors Q443 and Q441.

MOS transistor Q442 serves as a master stage of the current mirror circuit. MOS transistors Q443 and Q444 have their backgates connected to a power supply node.

When comparison circuits 11 and 12 are enabled and output node ND11 is at a voltage level lower than reference voltage VHset1 and VHset2, comparison circuits 11 and 12 set output drive control signals VG1 and VG3 to the L level. If output node ND11 is at a voltage level higher than reference voltage VHset1 and VHset2, comparison circuits 11 and 12 set output drive control signals VG1 and VG3 to the H level. When output node ND11 is at a voltage level between reference voltage VHset1 and VHset2, output drive control signals VG1 and VG2 attain the H and L levels, respectively.

In output buffer circuit 10, MOS transistor Q41 drives output node ND11 to the voltage level of reference voltage VHset1, while MOS transistor Q43 drives output node ND11 to the voltage level of reference voltage VHset2. Since MOS transistor Q41 is larger in size than MOS transistor Q43. Upon pulling up of output data DQ, MOS transistor Q41 drives node ND11 to the voltage level of reference voltage VHset1 rapidly and then MOS transistor Q43 drives the node ND11 to the voltage level of reference voltage VHset2. Thus, generation of overshoot in high speed operation can be prevented.

When output node ND11 is at a voltage higher than reference voltage VLset1, comparison circuit 13 sets output drive control signal VG2 to the H level, and when output node ND11 is at a voltage level lower than reference voltage VLset1, comparison circuit 13 sets output drive control signal VG2 to the L level.

When output node ND11 is at a voltage level higher than reference voltage VLset2, comparison circuit 14 sets output drive control signal VG4 to the H level, and when output node ND11 is at a voltage level lower than reference voltage VLset2, comparison circuit 14 sets output drive control signal VG4 to the L level.

Thus, with output buffer circuit 10, in pulling down output node ND 11, MOS transistor Q42 drives output node ND11 to the voltage level of reference voltage VLset1 and MOS transistor Q44 drives output node ND11 to the voltage level of reference voltage VLset2. With MOS transistor Q42 made greater in size than MOS transistor Q44, output node ND11 is pulled down, initially rapidly driven by MOS transistor Q42 to the voltage level of reference voltage VLset1 and then slowly driven by MOS transistor Q44 to the voltage level of reference voltage VLset2. Thus, generation of undershoot of output data DQ in high speed operation can be prevented.

Figure 5A:
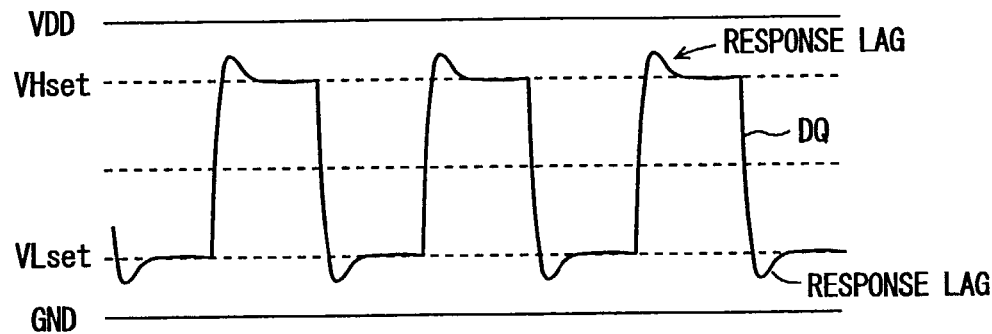
FIG. 5A represents a waveform of an output signal in a high speed operation with response lag.

If this semiconductor circuit device is further speeded up, a feedback path formed by a comparison circuit and an output drive circuit may cause a response lag. If such a response lag is caused, as shown in FIG. 5A, after data DQ exceeds reference voltage VHset or VLset, the output drive transistor is rendered non-conductive. Since the output node is driven rapidly, ringing would occur and a period of time is required before data is stabilized, and rapid data transfer could not be achieved. Furthermore, if output data is over-driven, the potential of output data might be shifted in one direction upon high speed transfer.

Figure 5B:
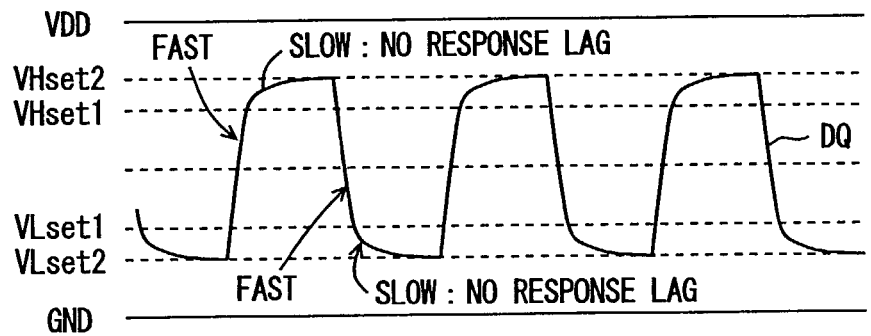
FIG. 5B is a signal waveform diagram representing an operation of an output circuit shown in FIG. 4.

As shown in FIG. 4, however, when output data DQ is pulled up, MOS transistor Q41 large in size and hence large in current driving capability and MOS transistor 43 small in current driving capability are used to drive output node ND11 and when the voltage level of output node ND11 exceeds reference voltage VHset1, MOS transistor Q41 having a greater current driving capability is rendered non-conductive and MOS transistor Q43 having a smaller current driving capability slowly drives output node ND11 to the voltage level of reference voltage VHset2. This two-step driving scheme can prevent overshoot, as shown in FIG. 5B, and ensures that output data DQ of the H level is limited in voltage level to reference voltage VHset2.

In this case, if a response lag is caused in comparison circuit 11 and output drive transistor Q41, the voltage level at output node ND11 does not attain a level of reference voltage VHset2. Before the voltage level at output node ND11 attains reference voltage VHset2, MOS transistor Q41 having a greater current driving capability can be rendered non-conductive in response to output drive control signal VG1 output from comparison circuit 11. Thereafter, MOS transistor Q43 having a smaller current driving capability drives output node ND11 slowly. Output node ND11 changes in voltage slowly, and a feedback path of comparison circuit 12 and MOS transistor Q43 does not suffer from response lag, and output data DQ of the H level can be reliably set to the voltage level of reference voltage VHset2.

Furthermore, in pulling down output data DQ, MOS transistor Q42 greater in size and hence in current driving capability and MOS transistor Q44 smaller in current driving capability are used to rapidly discharge output node ND11. When output node ND11 attains a voltage level of reference voltage VLset1, MOS transistor Q42 greater in current driving capability (or greater in size) is rendered non-conductive in response to output drive control signal VG2 output from comparison circuit 13. Thereafter, output node ND11 is driven to the voltage level of reference voltage VLset2 by MOS transistor Q44 having a smaller current driving capability.

Also in pulling down output data DQ, if response lag is caused in comparison circuit 13 and MOS transistor Q42 in high speed driving, output node ND11 does not have attains a voltage level of reference voltage VLset2 and if the feedback path of comparison circuit 13 and MOS transistor Q42 suffer from response lag, output drive control signal VG2 attains the ground voltage level before output node ND11 attains a voltage level of reference voltage VLset2, and MOS transistor Q42 can be rendered non-conductive.

Then, MOS transistor Q44 having a smaller current driving capability is used to slowly drive output node ND11 to the voltage level of reference voltage VLset2. In pulling down output node ND11 to reference voltage VLset2, voltage gradually changes and a response has no delay, and when node ND11 attains a voltage level of reference voltage VLset2, MOS transistor Q44 can be made non-conductive in response to output drive control signal VG4 to limit output data DQ of the L level to the voltage level of reference voltage VLset2.

Thus, in driving the output node, a MOS transistor greater in size and current driving capability can be made conductive to rapidly drive output node ND11 and thereafter a MOS transistor having a smaller current driving capability slowly drives the output node. Thus, in a high speed data transfer, output node ND11 is not over-swung and high speed transfer of output data having an amplitude precisely limited to a desired voltage level can be achieved.

It should be noted that comparison circuits 11–14 may provide a output signal changing in an analog manner according to a difference between a corresponding reference voltage and the voltage of the output node, or may operate to bi-level-drive the output signal digitally in accordance with a difference between the corresponding reference voltage and the voltage of the output node.

Figure 6:
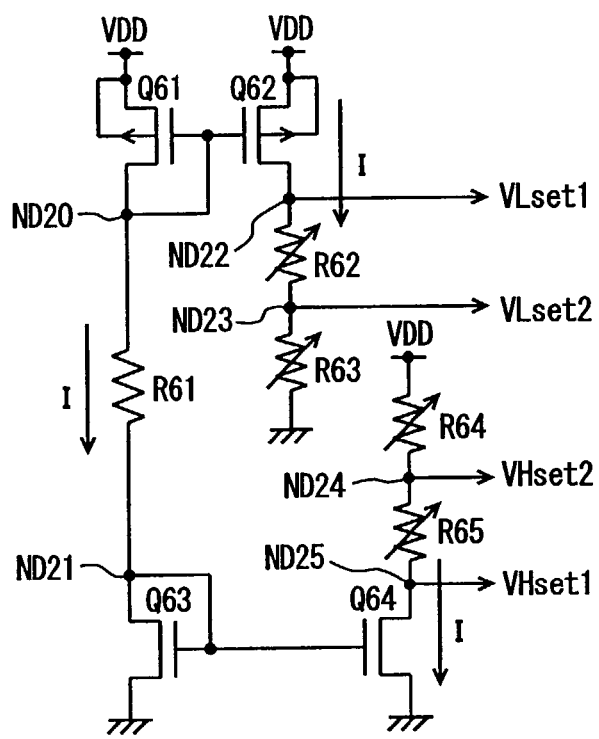
FIG. 6 shows an exemplary configuration of a circuit generating a reference voltage as shown in FIG. 4.

FIG. 6 shows an exemplary configuration of a reference voltage generation circuit generating a plurality of kinds of reference voltage shown in FIG. 4. In FIG. 6, the reference voltage generation circuit includes a p channel MOS transistor Q61 connected between a power supply node and a node ND20 and having a gate connected to node ND20, a resistance element R61 connected between nodes ND20 and ND21, and an n channel MOS transistor Q63 connected between node ND21 and a ground node and having a gate connected to node ND21. MOS transistors Q61 and Q63 and resistance element R61 constitute a constant current source, similarly to the configuration shown in FIG. 3, and generates a current I, as represented in the following equation:

$I=(VDD-|Vthp|-Vthn)/R61$, where Vthp and Vthn represent a threshold voltage of MOS transistor Q61 and that of MOS transistor Q63, respectively, and R61 represents a resistance value of resistance element R61. Furthermore, current I is constant current if power supply voltage VDD is constant.

The reference voltage generation circuit further includes a p channel MOS transistor Q62 connected between a power supply node and a node ND22 and having a gate connected to node ND20, and resistance elements R62 and R63 connected in series between node ND22 and a ground node. Reference voltage VLset1 is generated at node ND22 and reference voltage VLset2 is generated at a node ND23 between resistance elements R62 and R63.

The reference voltage generation circuit further includes resistance elements R64 and R65 connected in series between a power supply node and a node ND25, and an n channel MOS transistor Q64 connected between node ND25 and a ground node and having its gate connected to node ND21. Reference voltage VHset2 is generated between resistance elements R64 and R65 at node ND24 and reference voltage VHset1 is generated at node ND25.

MOS transistor Q62 forms a current mirror circuit with MOS transistor Q61, and if they are the same in size, MOS transistor Q62 causes current I to flow. Similarly, MOS transistor Q64 and MOS transistor Q63 form a current mirror, and MOS transistor Q64 flows current I equal in magnitude to current flowing through MOS transistor Q63, if they are the same in size. Thus, reference voltage VLset1, VLset2, VHset1 and VHset2 have voltage levels, as represented in the following equations, respectively:

$VLset1=I\cdot(R62+R63)$, $VLset2=I\cdot R63$, $VHset1=VDD-I\cdot(R64+R65)$, and $VHset2=VDD-I\cdot R64$.

Therefore, by constituting resistance elements R62–R65 with a laser-trimmable resistance elements with link elements having a resistance value adjustable by means of laser, reference voltage at a precisely set to a desired voltage level can be generated even if a process parameter varies in a manufacturing step and a device parameter accordingly varies.

Also in the reference voltage generation circuit configuration as shown in FIG. 6, reference voltage VHset1, VHset2, VLset1 and VLset2 are supplied to the gates of differential stage MOS transistors Q413, Q433, Q423 and Q443 in comparison circuits 11, 12, 13 and 14, respectively. As the gates are each small in capacitance, current I is a small current of several μA or so, as described in the first embodiment. Therefore, even if reference voltages generated is increased in number, increase in current consumption by the reference voltage generation circuit can be satisfactorily suppressed and the reference voltages at a plurality of levels can stably be generated for pulling up and for pulling down.

Furthermore, pulling up reference voltage VHset1 and VHset2 and pulling down reference voltage VLset1 and VLset2 can be generated through different paths and thus can have their respective voltage levels adjusted individually. Thus, even if a device parameter such as a threshold voltage and a resistance value vary, the reference voltages each can have the voltage levels individually set to an optimal level and data of a small amplitude having a voltage level set with high precision can be transferred at high speed.

In addition to amplitude limiting, the rate at which output data changes can be changed and the slew rate of the output data can be optimized.

Figure 7:
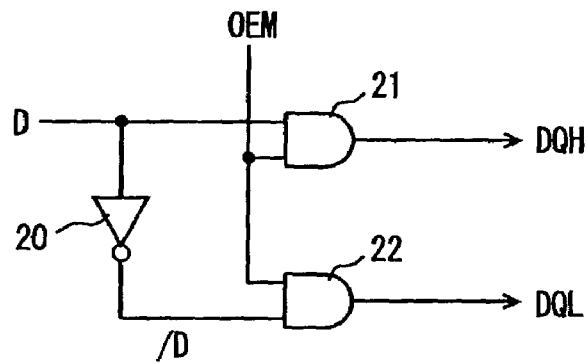
FIG. 7 shows an exemplary configuration of a portion generating an output control signal as shown in FIGS. 1 and 4.

FIG. 7 shows an exemplary configuration of a portion generating output control signals DQH and DQL. In FIG. 7, an output control signal generation portion includes an inverter 20 receiving internal data D, an AND circuit 21 receiving an output enable timing signal OEM and internal data D and generating output control signal DQH, and an AND circuit 22 receiving output enable timing signal OEM and complementary internal data /D from inverter 20 and generating output control signal DQL.

In the configuration shown in FIG. 7, when output enable timing signal OEM is at an L level, output control signals DQH and DQL both are at an L level. Thus, in this state, output buffer circuit 1 or 10 is in an output high impedance state.

When output enable timing signal OEM attains an H level, output control signals DQH and DQL are generated in accordance with internal data D.

Thus, when internal data D is output in response to output enable timing signal OEM via a data output circuit, for example, in a semiconductor memory device, an output circuit according to the first or second embodiment is applied for the output circuitry, internal read data can be transferred reliably at high speed.

Internal read data D may be complementary data D and /D transferred in parallel from an internal preamplifier internally provided, for example.

Figure 8:
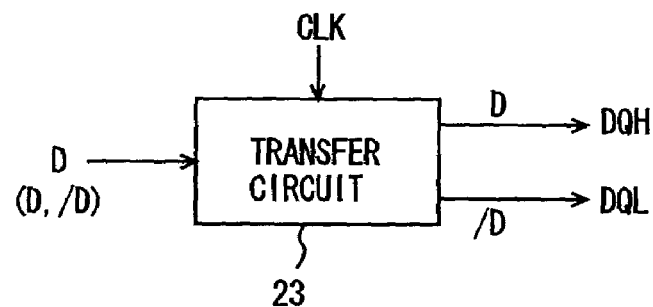
FIG. 8 schematically shows another configuration generating the output control signal shown in FIGS. 1 and 4.

FIG. 8 schematically shows another configuration of a portion generating the output control signals. In the configuration shown in FIG. 8, a transfer circuit 23 transferring internal data D in synchronization with a clock signal CLK generates output control signals DQH and DQL. Specifically, transfer circuit 23 is constructed, for example, of a latch circuit and transfers internal data to generate complementary data D and /D in synchronization with clock signal CLK transitioning from L to H levels or H to L levels. Complementary internal data D and /D are used as output control signals DQH and DQL, respectively.

In a circuit device such as a logic in which output control signals DQH and DQL are generated in accordance with internal data D and /D by means of transfer circuit 23 as shown in FIG. 8 when the output circuit according to the first or second embodiment is utilized, data can be reliably transferred at high speed.

Also in the configuration shown in FIG. 8, transfer circuit 23 may be configured to receive complementary data D and /D.

Thus, the semiconductor circuit device according to the present invention can be used for data output circuits of semiconductor memory devices and data output circuit portions of general logic circuits. Furthermore, the semiconductor circuit device according to the present invention may be applied to a circuit generating a bi-level signal such as a control signal, in place of the data.

Furthermore, in the semiconductor circuit device as shown in FIG. 4, the output node is pulled up/down in a 2-stape operation. However, the output node may be pulled up/down in three or more steps. In this case, each individual output drive transistor is not required to be different in size, and a plurality of output transistors can be used to pull up/down the output node, followed by pull up/pull down finally by a single output transistor, over-swing of the output node can be reliably suppressed.

As described so far, according to the present invention, an output drive transistor is controlled in accordance with a result of comparison between a voltage of an output node and a reference voltage. Thus, an output signal can have an amplitude limited with high precision and without an additional power supply terminal, and a signal of a small amplitude can be transferred stably at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device for producing an output data corresponding to an internal data on an output node, comprising:
   a first output transistor coupled between a first power supply node and an output node; and
   first output control circuitry for comparing a voltage of said output node with a first reference voltage and controlling an amount of current flowing through said first output transistor in an analog fashion so as for the amount of the current to change continuously in accordance with a result of comparison, said first output control circuitry comprising a differential amplifier circuit enabled in response to a first output control signal, for differentially amplifying the voltage of said output node and said first reference voltage and applying a signal indicative of a result of differential amplification to a control electrode of said first output transistor, said first output control signal being generated in accordance with said internal data and an output timing control signal.

2. The semiconductor circuit device according to claim 1, further comprising:
   a second output transistor coupled between said first power supply node and said output node; and
   second output control circuitry for comparing the voltage of said output node with a second reference voltage at a voltage level different from said first reference voltage, and controlling an amount of current flowing through said second output transistor in an analog fashion so as for the amount of the current to change continuously in accordance with a result of comparison.

3. The semiconductor circuit device according to claim 2, wherein said second output transistor is different in current driving capability from said first output transistor under a condition of a same control gate voltage being applied.

4. The semiconductor circuit device according to claim 2, wherein said second output control circuitry comprises a differential amplification circuit enabled in response to said first output control signal, for differentially amplifying the voltage of said output node and said second reference voltage and applying an output signal thereof to a control electrode node of said second output transistor.

5. The semiconductor circuit device according to claim 1, further comprising:
   a second output transistor coupled between a second power supply node and said output node; and
   second output control circuitry for comparing the voltage of said output node with a second reference voltage and controlling an amount of driving current of said second output transistor in accordance with a result of comparison.

6. The semiconductor circuit device according to claim 5, wherein said second reference voltage and said first reference voltage each have a voltage level set individually.

7. The semiconductor circuit device according to claim 5, wherein said second output control circuitry comprises a differential amplification circuit enabled in response to a second output control signal, for differentially amplifying the voltage of said output node and said second reference voltage and applying an output signal thereof to a control electrode node of said second output transistor.

8. A semiconductor circuit device comprising:
   a plurality of pull up transistors connected between a first power supply node and an output node in parallel with each other;
   first reference voltage generation circuitry for generating a plurality of pull up reference voltages corresponding to said plurality of pull up transistors and different in voltage level from each other;
   a plurality of pull up control circuits, arranged corresponding to said plurality of pull up transistors, each enabled in response to a first output control signal for comparing a voltage of said output node with a corresponding pull up reference voltage generated by said first reference voltage generation circuitry, and adjusting a potential of a control electrode of a corresponding pull up transistor in an analog fashion so as for the potential to change continuously in accordance with a result of comparison;
   a plurality of pull down transistors connected between a second power supply node and said output node in parallel with each other;
   second reference voltage generation circuitry for generating a plurality of pull down reference voltages corresponding to said plurality of pull down transistors and different in voltage level from each other; and
   a plurality of pull down control circuits, arranged corresponding to said plurality of pull down transistors, each for comparing the voltage of said output node with a corresponding pull down reference voltage, and controlling a potential of a control electrode of a corresponding pull down transistor in analog fashion so as for the potential to change continuously.

9. The semiconductor circuit device according to claim 8, wherein said plurality of pull up transistors are different in current driving capability from each other under a condition of a same control electrode voltage being applied.

10. The semiconductor circuit device according to claim 8, wherein said plurality of pull down transistors are different in current driving capability from each other under a condition of a same control electrode voltage being applied.

11. The semiconductor circuit device according to claim 8, wherein said first reference voltage generation circuitry and said second reference voltage generation circuitry individually set the voltage levels of said plurality of pull up reference voltages and said plurality of pull down reference voltages, respectively.

12. The semiconductor circuit device according to claim 8, wherein said plurality of pull up control circuits and said plurality of pull down control circuits each comprise a differential amplification circuit for differentially amplifying the corresponding reference voltage and the voltage of said output node and transmitting an output signal thereof to the control electrode of the corresponding transistor.

13. The semiconductor circuit device according to claim 8, wherein the plurality of pull up control circuits each are enabled in response to a first output control signal, and
the plurality of pull down control circuits are each enabled in response to a second output control signal.

14. The semiconductor circuit device according to claim 13, wherein the first and second output control signals are each generating in accordance with an output data and an output timing control signal.

* * * * *